(12) United States Patent
Jung et al.

(10) Patent No.: US 12,389,787 B2
(45) Date of Patent: Aug. 12, 2025

(54) THREE-DIMENSIONAL NANOSTRUCTURE USING NANOPARTICLES AND METHOD FOR PREPARING SAME

(71) Applicant: KOREA ADVANCED INSTITUTE OF SCIENCE AND TECHNOLOGY, Daejeon (KR)

(72) Inventors: Yeon Sik Jung, Daejeon (KR); Geon Yeong Kim, Daejeon (KR); Moohyun Kim, Daejeon (KR); Kyeongmin Song, Daejeon (KR); Hongjoo Shin, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 40 days.

(21) Appl. No.: 18/243,982

(22) Filed: Sep. 8, 2023

(65) Prior Publication Data
US 2024/0357915 A1 Oct. 24, 2024

(30) Foreign Application Priority Data
Apr. 21, 2023 (KR) .......................... 10-2023-0052760

(51) Int. Cl.
*H10K 71/20* (2023.01)
*B82Y 30/00* (2011.01)
*B82Y 40/00* (2011.01)

(52) U.S. Cl.
CPC ............ *H10K 71/211* (2023.02); *B82Y 30/00* (2013.01); *B82Y 40/00* (2013.01)

(58) Field of Classification Search
None
See application file for complete search history.

(56) References Cited

U.S. PATENT DOCUMENTS

2006/0003097 A1* 1/2006 Andres .................. B22F 1/102
427/256

* cited by examiner

*Primary Examiner* — Michael P. Rodriguez

(57) ABSTRACT

There is provided a method for preparing a three-dimensional nanostructure using nanoparticles, which includes: a step of surface-treating a patterned pattern substrate with a polymer; a step of coating colloidal nanoparticles on the polymer; a step of removing an unwanted nanoparticle coating layer, leaving behind a nanoparticle coating layer; a step of bonding a carrier substrate having adhevisity to the nanoparticle coating layer; a step of separating the nanoparticle coating layer from the pattern substrate by separating the carrier substrate from the pattern substrate; and a step of forming a nanoparticle layer on a target substrate by contacting the carrier substrate with the target substrate and then removing the carrier substrate by immersing the carrier substrate in a solution.

19 Claims, 15 Drawing Sheets

Pattern quality

High picking yield (thickness)

High transfer yield     Large-area scale

Low roughness

| CD (nm) | LWR (nm) | LER (nm) |
|---|---|---|
| 353 | 6 | 4 |

| CD (nm) | LWR (nm) | LER (nm) |
|---|---|---|
| 311 | 49 | 27 |

| CD (nm) | LWR (nm) | LER (nm) |
|---|---|---|
| 233 | 84 | 70 |

| CD (nm) | LWR (nm) | LER (nm) |
|---|---|---|
| 208 | 6 | 4 |

3D symmetry control

Orthogonal layers     Orthogonal layers

+45° twisted layers     −45° twisted layers

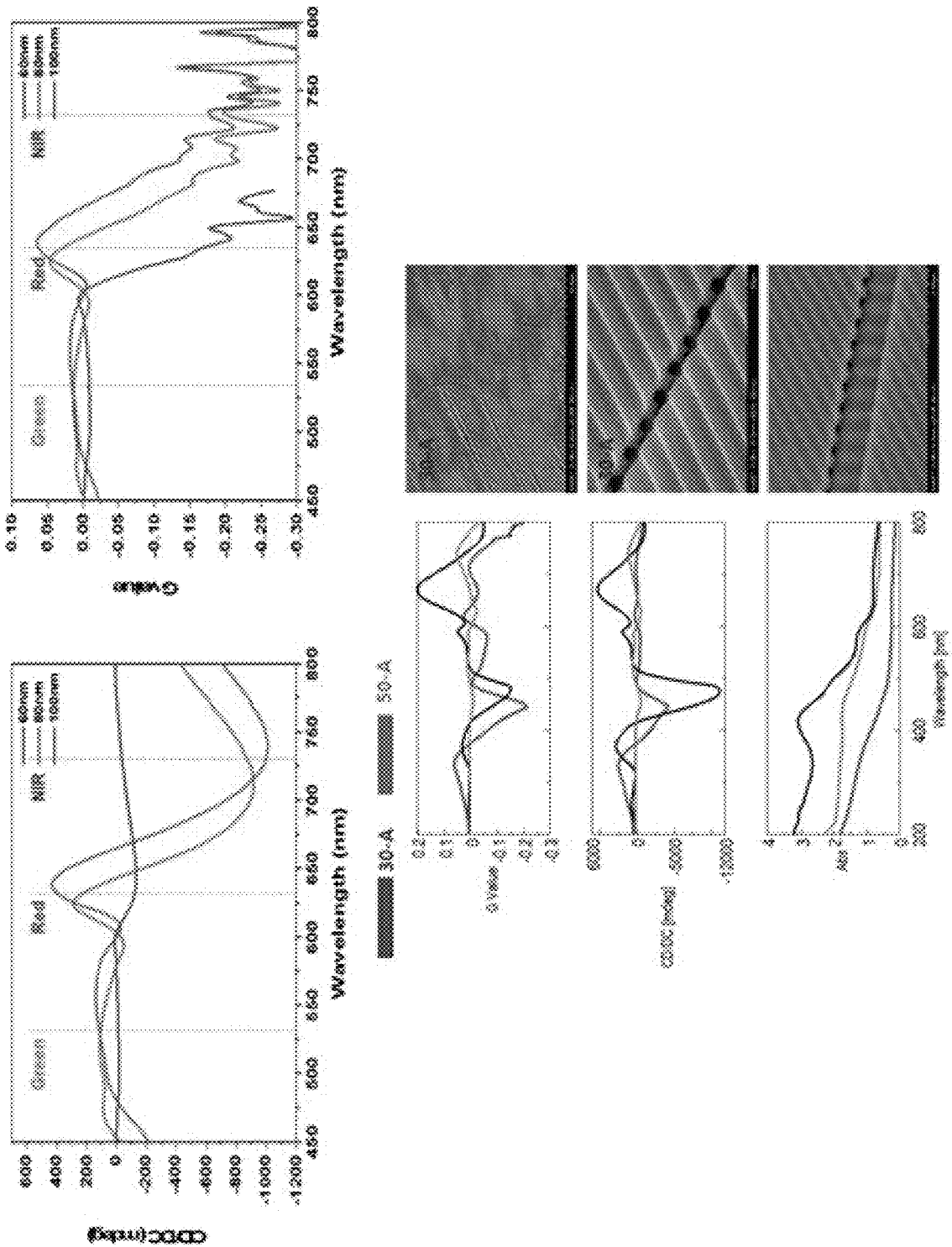
FIG. 9 – Continued

THREE-DIMENSIONAL NANOSTRUCTURE USING NANOPARTICLES AND METHOD FOR PREPARING SAME

CROSS-REFERENCE TO RELATED APPLICATION

This application claims priority of Korean Patent Application No. 10-2023-0052760, filed on Apr. 21, 2023, in the KIPO (Korean Intellectual Property Office), the disclosure of which is incorporated herein entirely by reference.

BACKGROUND OF THE INVENTION

Field of the Invention

The present disclosure relates to a three-dimensional nanostructure using nanoparticles and a method for preparing the same, more particularly to a three-dimensional nanostructure with a large area using a colloidal solution of nanoparticles and a method for preparing the same.

This research was supported by Creative Materials Discovery Program through the National Research Foundation of Korea (NRF) funded by the Ministry of Science, ICT and Future Planning (NRF-2016M3D1A190003524, 2021R1A6A3A1304444511, and 2021M3H4A3A0106296312).

Description of the Related Art

Nanostructures or nanoscale structures are currently used in various technical fields such as electronic materials (e.g., electrodes, light-emitting diodes (LEDs) and solar cells), semiconductor manufacturing processes, data storage devices, wearable devices, various sensors (e.g., flexible sensors, electrochemical sensors and biosensors), etc. In particular, nanoscale structures such as nanorods, nanopillars or nanowires are widely used in various electronic and optical devices due to their unique optical and electrical properties. The nanoscale fine pattern is an important factor in imparting new functions in addition to increasing time and space efficiency, and the demand for nanostructures satisfying this requirement is increasing.

The technologies for forming nanoscale fine patterns are include patterning with light (photolithography, etc.), physical contact patterning (soft lithography, surface imprinting, embossing, etc.), self-assembly (molecularly imprinted polymers, etc.) and direct writing (dip-pen nanolithography, inkjet printing, etc.).

However, a technology for manufacturing a three-dimensional structure with a large area using nanoparticles has not been disclosed yet. In particular, a method for manufacturing a nanostructure with a large area from colloidal particles in a solution state by a bottom-up method has not been disclosed at all.

SUMMARY OF THE INVENTION

The present disclosure is directed to providing a method for preparing a three-dimensional nanostructure with a large area using a colloidal solution of nanoparticles and its application.

The present disclosure provides a method for preparing a three-dimensional nanostructure using nanoparticles, which includes: a step of surface-treating a patterned pattern substrate with a polymer; a step of coating colloidal nanoparticles on the polymer; a step of removing an unwanted nanoparticle coating layer; a step of bonding a carrier substrate having adhevisity to the nanoparticle coating layer; a step of separating the nanoparticle coating layer from the pattern substrate by separating the carrier substrate from the pattern substrate; and a step of forming a nanoparticle layer on a target substrate by contacting the carrier polymer with the target substrate and then removing the carrier polymer by immersing the carrier polymer in a solution.

In an exemplary embodiment of the present disclosure, the method further includes a step of forming another nanoparticle layer on the nanoparticle layer by repeating the method after the nanoparticle layer has been formed.

In an exemplary embodiment of the present disclosure, the method further includes a step of removing the step of the nanoparticle layer by conducting a capping process of filling the pattern between the nanoparticle layer after the nanoparticle layer has been formed before repeating the method.

In an exemplary embodiment of the present disclosure, the unwanted nanoparticle coating layer is removed by a stamping method.

In an exemplary embodiment of the present disclosure, when the nanoparticles have high hydrophilicity, the polymer used for the surface treatment is selected to have high hydrophilicity.

In an exemplary embodiment of the present disclosure, the nanoparticles are quantum dots, and the quantum dot may be one or more selected from a group consisting of CdSe, InP, PbS and ZnO.

In an exemplary embodiment of the present disclosure, the solution selectively dissolves only the carrier polymer without dissolving the nanoparticle coating layer and the target substrate.

The present disclosure also provides a three-dimensional nanostructure prepared by the method described above.

In an exemplary embodiment of the present disclosure, nanoparticles are stacked in the nanostructure.

In an exemplary embodiment of the present disclosure, the three-dimensional nanostructure has a multi-layer patterned structure.

In an exemplary embodiment of the present disclosure, the multi-layer patterned structure is in the form of lines and the angle of the lines between the layers is twisted as desired.

The present disclosure also provides a display including the nanostructure described above, wherein the nanostructure includes quantum dots.

The present disclosure solves the problem of the prior art that it is difficult to prepare a three-dimensional structure from a colloidal solution through surface treatment of a substrate using a polymer and use of a nanoparticle solution. In particular, compared to the existing structure without a pattern, various optical properties can be implemented according to the initial substrate pattern, nanostructures with precise patterns such as mesh patterns can be realized, and multiple layers can be formed with the same or different materials. Therefore, the structure can be utilized not only in optical devices but also all the electronic devices using nanoparticles.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1A:
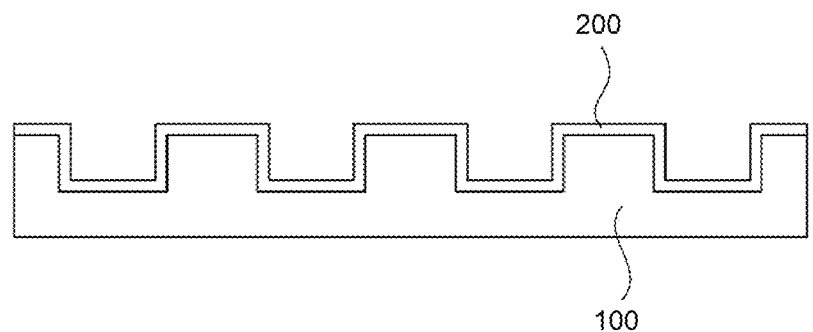
FIGS. 1A-1H are cross-sectional views illustrating a method for preparing a colloidal solution-based three-dimensional nanostructure according to an exemplary embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

FIGS. 1A-1H are cross-sectional views illustrating a method for preparing a colloidal solution-based three-dimensional nanostructure according to an exemplary embodiment of the present disclosure.

Referring to FIG. 1A, a substrate 100 having a desired pattern is surface-treated with a polymer 200 having characteristics corresponding to the nanoparticles to be coated. In an exemplary embodiment of the present disclosure, the surface treatment may be carried out by brushing, although the scope of the present disclosure is not limited thereto.

Figure 1B:
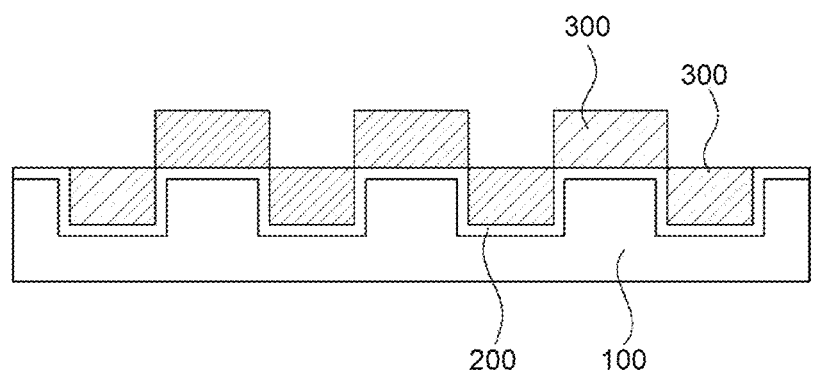
Figure 1C:
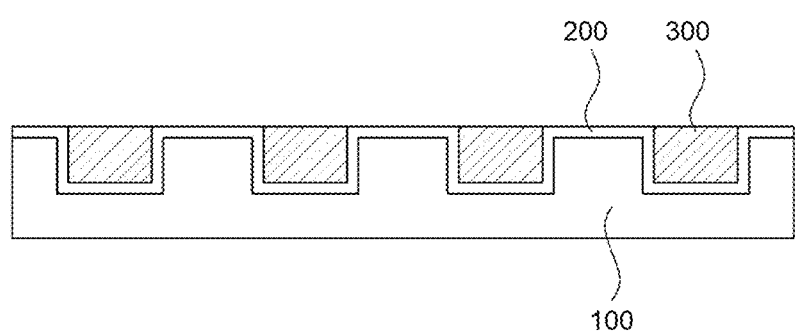

Then, colloidal nanoparticles 300 that constitute a nanostructure are coated on the substrate surface-treated with the polymer (FIG. 1B). Thereafter, the coated nanoparticle film in the mesa area exposed above the trench area is selectively removed by stamping using a PDMS mold (FIG. 1C), thereby completing a coating process. In FIG. 1B, the mesa and trench areas are marked separately. But, thin nanoparticle layers are connected with each other and, if the nanoparticle layer exposed upward is bonded to a stamping substrate and then removed by stamping, only the nanoparticle layer remains within the trench as shown in FIG. 1C.

Figure 1D:
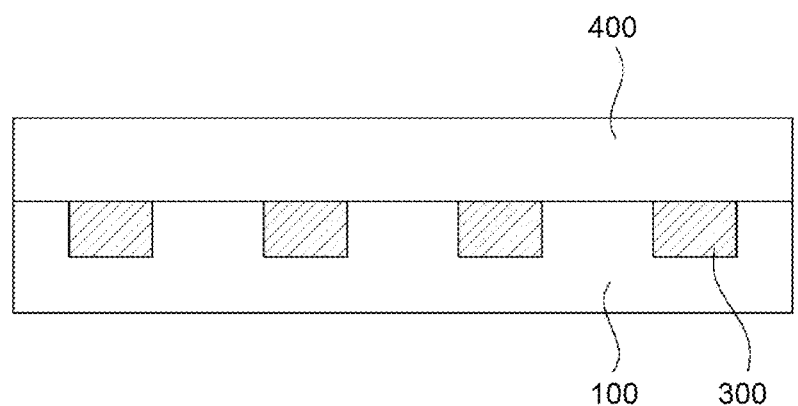
Figure 1E:
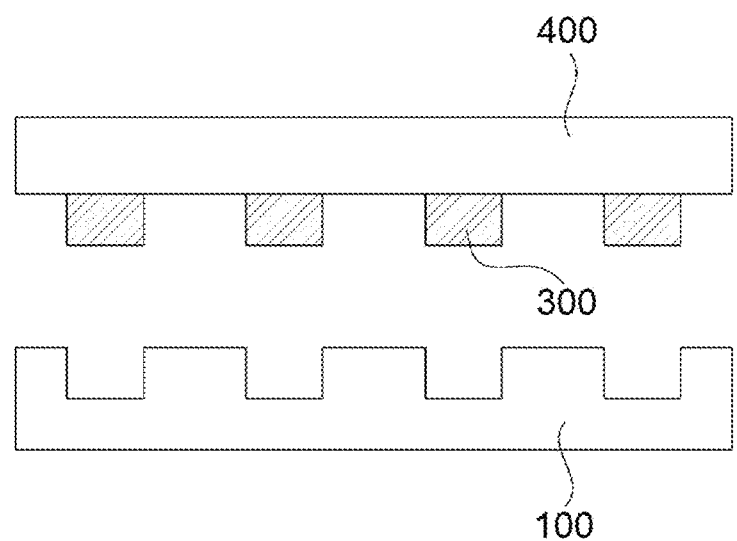

Referring to FIG. 1D, after a carrier substrate (carrier polymer, 400) is coated on the substrate, the carrier substrate is bonded to the nanoparticle film within the trench. Accordingly, the bonding strength between the carrier substrate 400 and the nanoparticle layer 300 in the trench is important and, when the carrier substrate 400 is detached, the nanoparticle layer should have sufficient bonding strength with the carrier substrate 400.

Figure 1F:
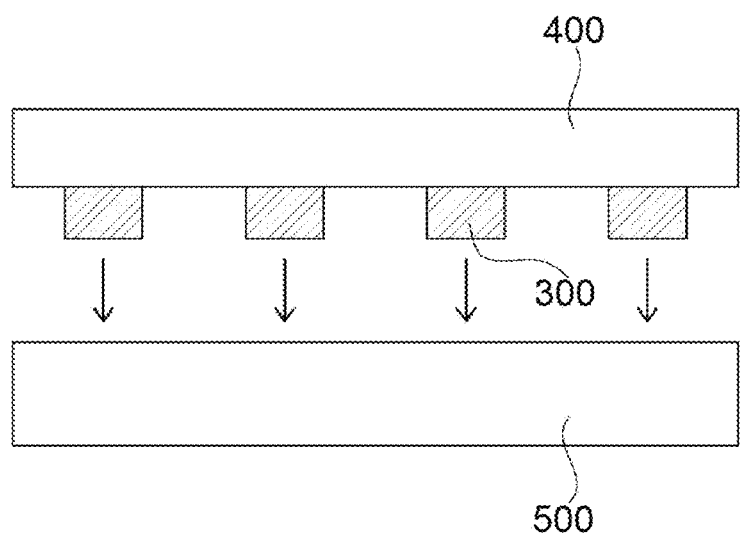
Figure 1G:
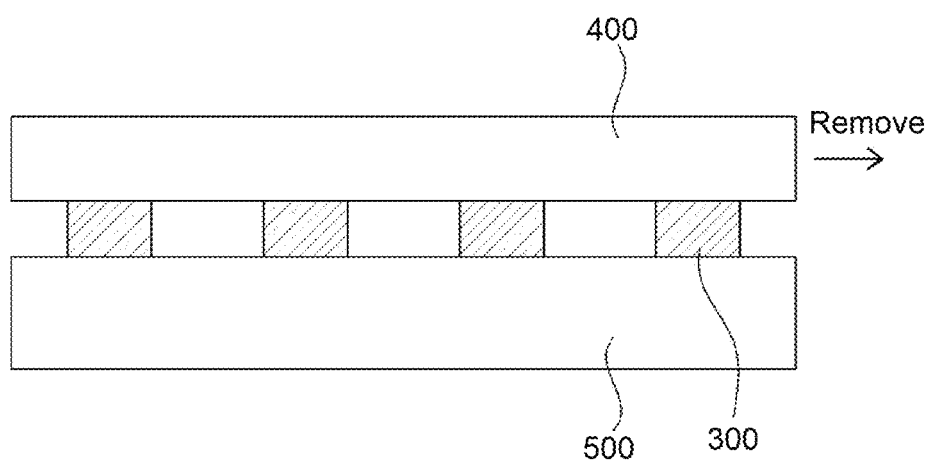

Thereafter, the carrier substrate 400 is detached (FIG. 1E), and transferred and bonded to a desired target substrate 500 (FIG. 1F). Then, the carrier substrate (carrier polymer, 400) is dissolved by immersing the entire substrate in a solvent, etc.

Figure 1H:
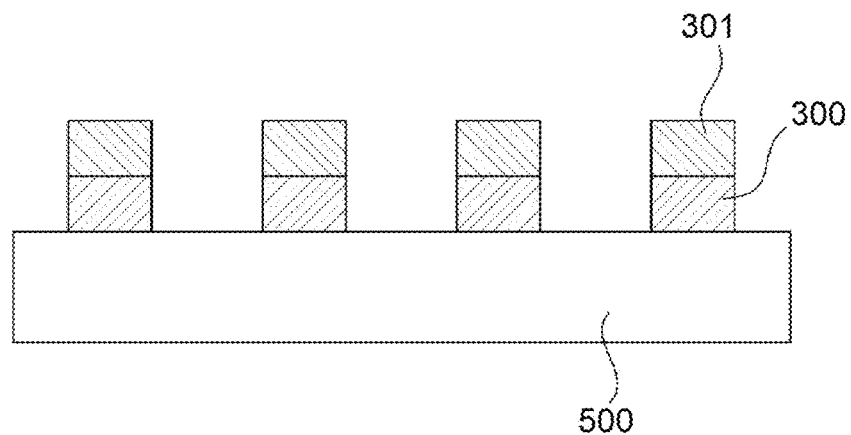

As a result, a nanostructure composed of nanoparticles having a desired pattern is formed on the target substrate, and a multi-layered three-dimensional structure 301, 302 with a desired height may be prepared by repeating this process (FIG. 1H). In this case, by changing the angle or position of a line pattern, three-dimensional structures with various patterns can be prepared.

In particular, a multi-layered pattern can be formed sequentially with desired dimensions and patterns. In this case, as shown in FIG. 1H, nanostructures with different interlayer patterns can be formed and, through this, a three-dimensional degree of freedom can be obtained during the designing of the structure. This can be confirmed by the various multi-layered pattern structures shown in FIG. 3.

In an exemplary embodiment of the present disclosure, the nanoparticles may be quantum dots such as CdSe, InP, ZnO, PbS, etc. However, the scope of the present disclosure is not limited thereto and any material that can be used in semiconductor or other electronic devices and can form colloidal nanoparticles is included in the scope of the present disclosure.

Therefore, according to the present disclosure, a three-dimensional nanostructure can be prepared using solution-based colloidal quantum dots, and it is possible to prepare a nanostructure with a desired thickness by controlling thickness, number of processes, etc.

Figure 2:
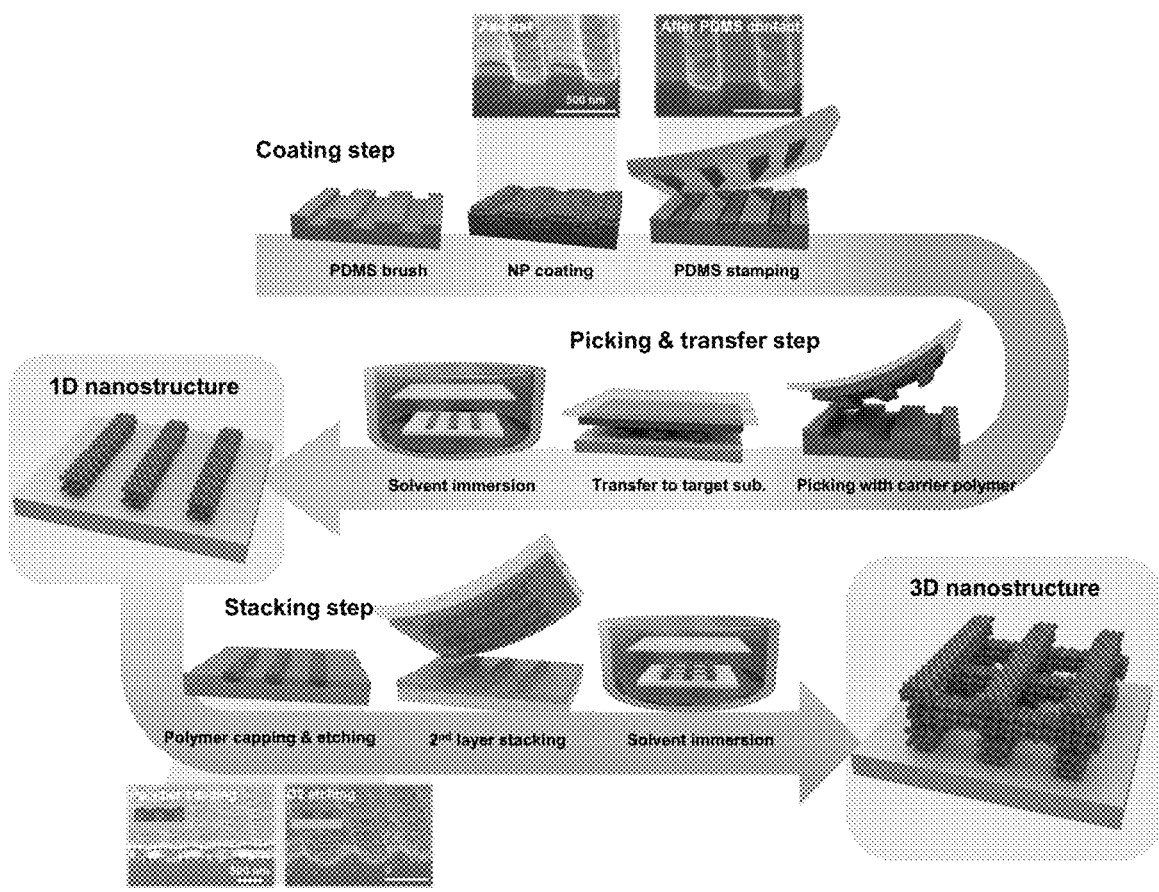
FIG. 2 is a schematic view describing the preparation method according to FIGS. 1A-1H.

FIG. 2 is a schematic view describing the preparation method according to FIGS. 1A-1H.

Referring to FIG. 2, a desired nanomaterial can be effectively transferred to a desired layer for use as a light-emitting layer of a display or an optical layer of an optical device.

Hereinafter, the present disclosure will be described in more detail through an example and a test example.

Example

Coating Step

First, a patterned silicon substrate in the form of a nanowire with a trench width of 300 nm, a mesa width of 300 nm and a depth of 180 nm was used as a template. Since the nanoparticle layer of the desired nanostructure is coated on the substrate surface-treated by brushing, etc. with a polymer, the type and range of the substrate is not specially limited.

Then, the substrate was surface-treated by brushing, i.e., coating and heat treatment with a specific polymer for control of the surface energy of the pattern substrate (brush treatment). In the present disclosure, the polymer for the surface treatment is determined depending on the hydrophobicity/hydrophilicity of the nanoparticle solution. In an exemplary embodiment of the present disclosure, polydimethylsiloxane (PDMS) and polystyrene (PS) with small molecular weights were used by dissolving in a solvent (toluene or heptane).

In the present disclosure, the type of the polymer used for the brushing is determined depending on the hydrophilic/hydrophobic characteristics of the nanoparticles. If the nanoparticles coated on the substrate are hydrophilic, the substrate is surface-treated with a hydrophilic polymer. And, if the nanoparticles are hydrophobic, a relatively hydrophobic polymer is used to surface-treat the substrate.

That is to say, polymers with higher hydrophilicity may be used for nanoparticles with higher hydrophilicity, and substrates with higher hydrophobicity may be surface-treated with nanoparticles with higher hydrophobicity. The hydrophilicity/hydrophobicity of the polymer is compared relatively.

For example, among PDMS and PS, which are the polymers used for surface treatment in an exemplary embodiment of the present disclosure, PDMS is relatively more hydrophobic, and PS is relatively more hydrophilic. Therefore, in this case, when the nanostructure is prepared from hydrophilic nanoparticles, the polymer used for the surface treatment has a higher PS content as compared to the polymer used for hydrophobic nanoparticles. In contrast, when the nanostructure is prepared from hydrophobic nanoparticles, the content of hydrophobic PDMS in the polymer is higher than that of the hydrophilic polymer.

When the nanoparticles used in the present disclosure are quantum dots having hydrophobic surfaces such as CdSe or InP, a solution of PDMS dissolved in a heptane solvent is used as a hydrophobic polymer. And, for ZnO having hydrophilic surface, a polymer solution of 80% PDMS and 20% PS dissolved in a heptane solvent is used to increase the content of the hydrophilic polymer PS. That is to say, in the present disclosure, polymers with corresponding hydrophilic/hydrophobic characteristics are used depending on the hydrophilic/hydrophobic characteristics of the substrate.

In this example, four quantum dot nanoparticles, CdSe, InP, PbS and ZnO, were used as nanoparticles. The four nanoparticles synthesized according to known methods were coated on the brushing-treated nanowire template substrate. The polymers used for the brushing treatment are selected in consideration of the hydrophilic/hydrophobic characters of the nanoparticles, adhesive strength to a carrier substrate use to detach them, etc.

Afterwards, in order to remove the nanoparticle film in the mesa area except for the trench area, a PDMS mold was fabricated and physically contacted physically (stamping). The PDMS mold was fabricated using Sylgard 184 by a curing process accompanied by vacuum and heat treatment. CdSe and InP could be removed with a bare PDMS mold, but relatively hydrophilic materials such as PbS and ZnO were treated after modifying the surface of the PDMS mold with hydrophilic groups through UV-ozone treatment.

Picking and Transfer Step

In order to detach the nanoparticle film selectively only from the trench area, a carrier substrate (carrier polymer) was coated first. The carrier substrate should have strong bonding strength and high affinity for the nanofilm on the brushing-treated polymer and should have surface energy similar to that of the nanoparticle film to be detached and separated.

That is to say, the carrier substrate should have higher bonding strength for the nanoparticle film than the template substrate (brushing-treated polymer). If the bonding strength between the carrier substrate and the template substrate brushing-treated with the polymer is too strong, it is impossible to detach the carrier substrate in the next step. Accordingly, the carrier substrate should not damage the quantum dots and should have large energy with the template substrate (surface-treated polymer layer) so that detachment is possible.

Then, an adhesive means such as a polyimide (PI) tape was attached to the coated carrier substrate and the carrier substrate was physically separated from the template substrate (picking). As a result of the detachment by physical separation, the PI tape/carrier substrate/nanoparticle film is separated from the template substrate as a whole in a stacked state.

Thereafter, the stacked layers are contacted to any desired substrate and immersed in a specific solvent (solvent immersion). As a result, as the carrier substrate (carrier polymer) between the PI tape and the nanoparticle pattern is dissolved selectively by the solvent over time, the nanopattern is transferred to the target substrate. The immersion solvent for the pattern transfer should dissolve the carrier substrate but should not dissolve or damage the nanoparticle film.

Acetone, toluene or a mixture thereof may be used as the solvent, although the scope of the present disclosure is not limited thereto.

Stacking Step

Through the above process, one layer of the nanoparticle film was transferred to the target substrate. For preparation of a 3D suspended structure through further stacking, a specific polymer (capping polymer) was filled in the void space between the pattern transferred in advance (corresponding to the void space between nanowires) and the step of the nanowire pattern was adjusted through etching. The etching process after filling of the capping polymer is generally for preventing the collapse of the upper structure into the lower structure during the formation of the 3D nanostructure for the purpose of solving the problem of difficulty in physically separating while maintaining the void space in the structure.

Thereafter, a three-dimensional nanoparticle structure was prepared by stacking another nanoparticle film on the nanoparticle film by repeating the coating and transfer steps described above.

In the present disclosure, the capping polymer which eliminates the step caused by the pattern of the nanostructure on the substrate may be selected differently depending on the type of the nanoparticles. A solvent which dissolves or damages the nanoparticle cannot be used, and the polymer should be selectively dissolved in the immersion solvent used in the transfer step. In addition, etching should be carried out sufficiently in an etching process (for example, an etching process using oxygen plasma ($O_2$ reactive ion etching)). In this example, the polymer was PS and/or PMMA and the solvent was acetone and/or toluene, although the scope of the present disclosure is not limited thereto.

Figure 3:
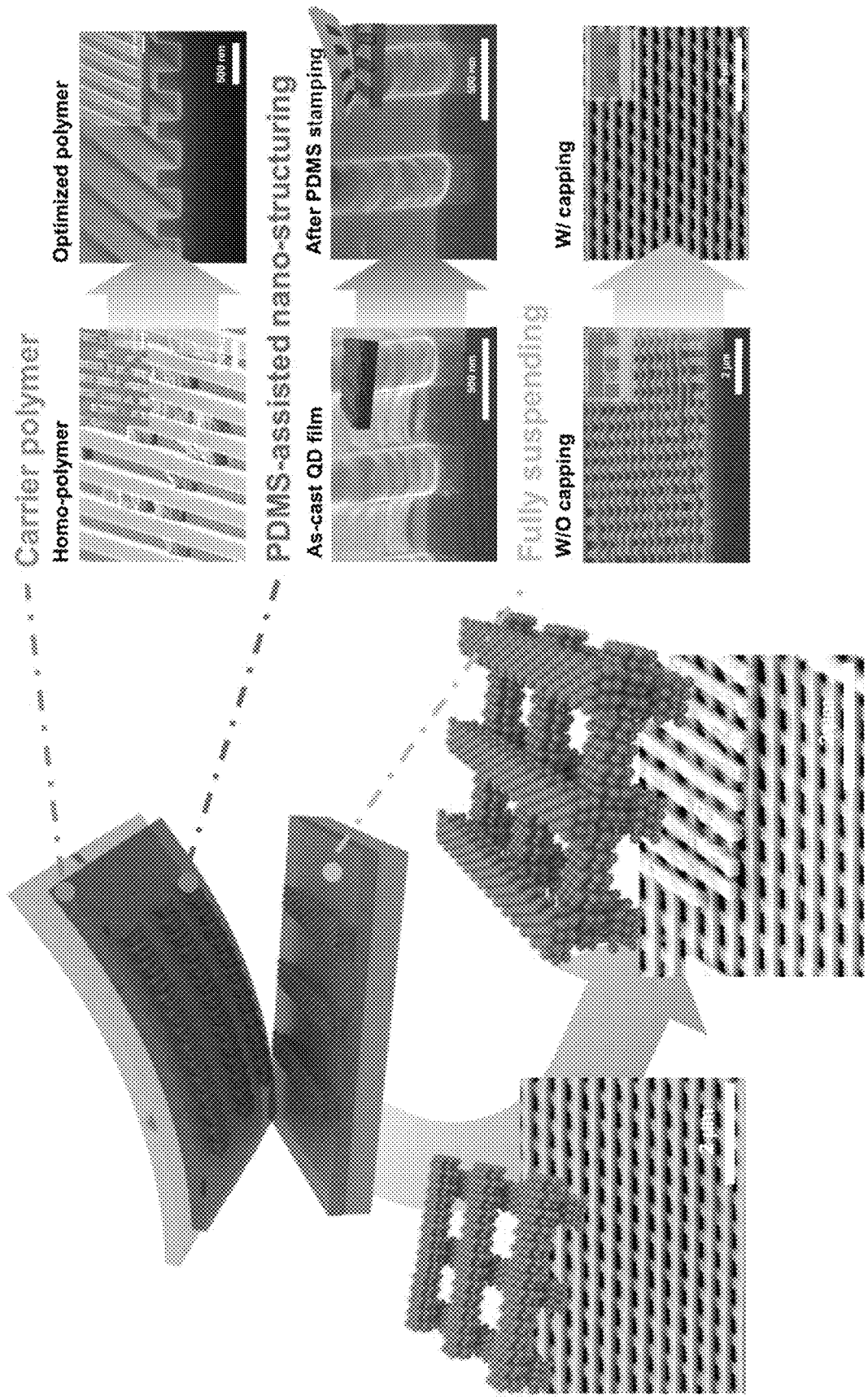
FIGS. 3 and 4 describe the advantages of a pattern of a solution-based three-dimensional structure formed according to the present disclosure in terms of pattern quality and control of 3D symmetry.
Figure 4:
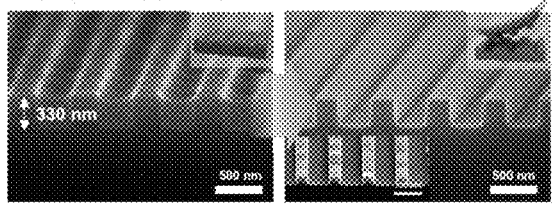
Figure 4:
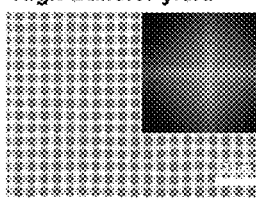
Figure 4:
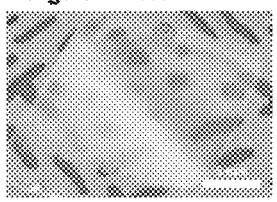
Figure 4:
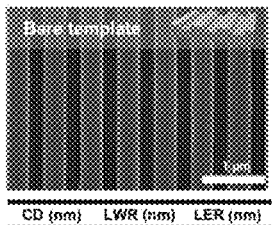
Figure 4:
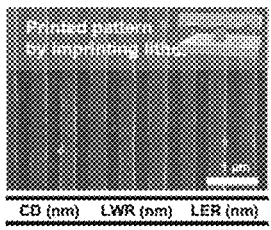
Figure 4:
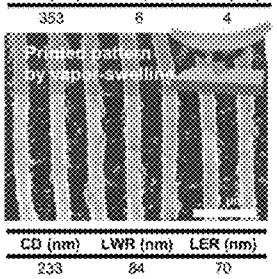
Figure 4:
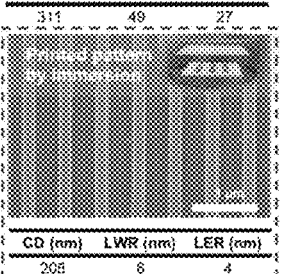
Figure 4:
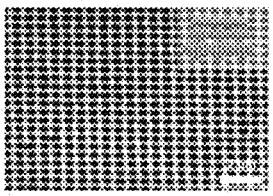
Figure 4:
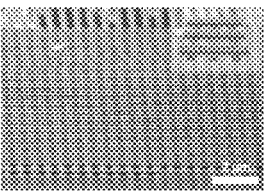
Figure 4:
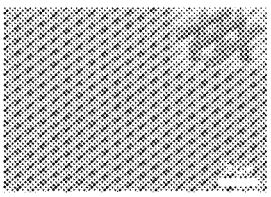
Figure 4:
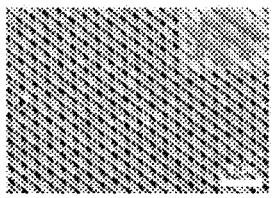

FIGS. 3 and 4 describe the advantages of the pattern of the solution-based three-dimensional structure formed according to the present disclosure in terms of pattern quality and control of 3D symmetry.

Referring to FIGS. 3 and 4, it can be seen that a three-dimensional structure was stacked with a desired shape in a highly ordered from even though the process was a solution process (see the pattern quality). In addition, it can be seen that the three-dimensional structure was stacked with very high uniformity and symmetry when the capping material was used (see w/capping).

Test Example

Figure 5:
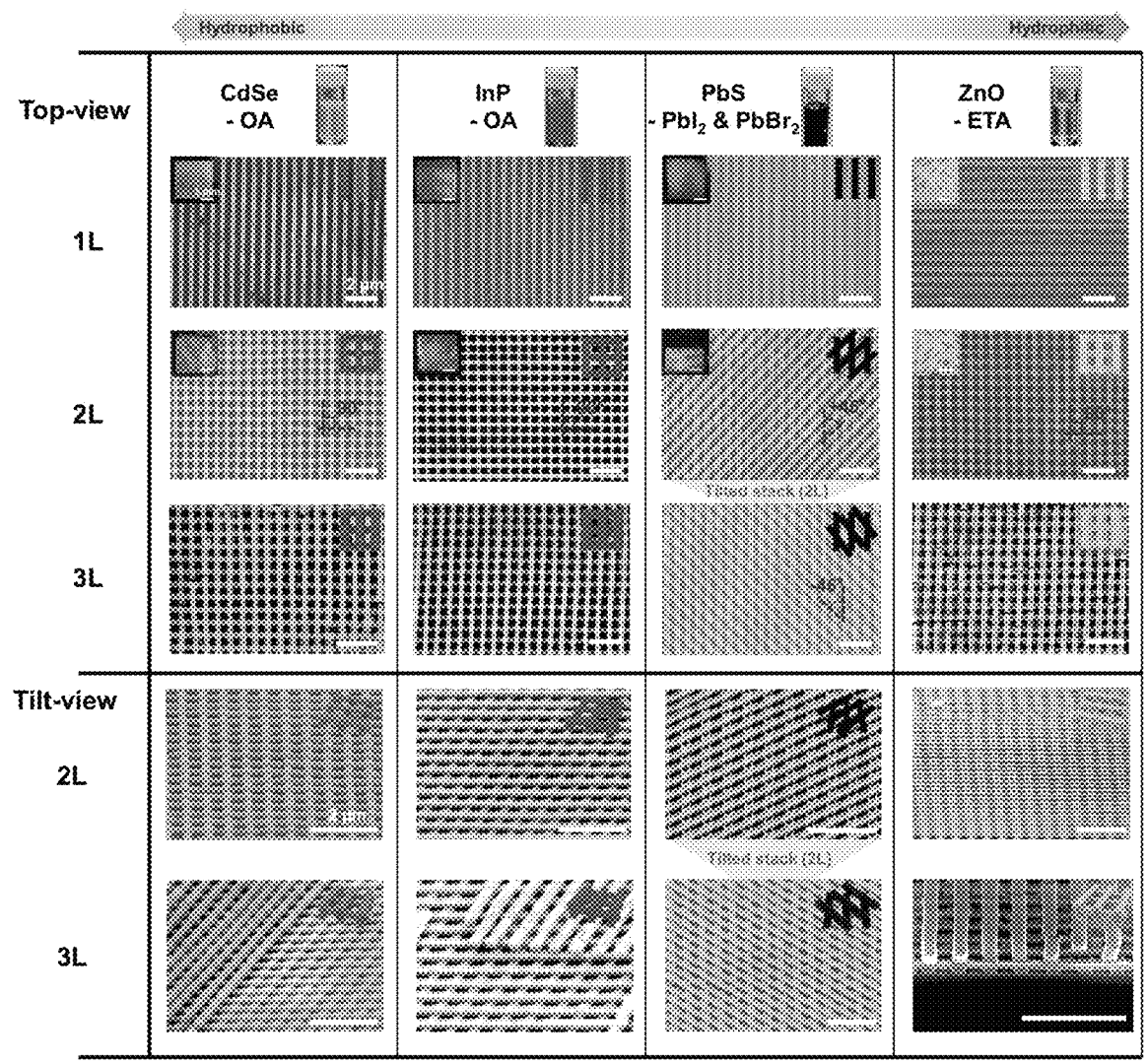
FIG. 5 shows the images of nanopatterns formed using four nanoparticles and polymers according to an exemplary embodiment of the present disclosure.

FIG. 5 shows the images of the nanopatterns formed using four nanoparticles and polymers according to an exemplary embodiment of the present disclosure.

Referring to FIG. 5, it can be seen that a three-dimensional structure with a desired pattern can be prepared effectively on a substrate using four types of quantum dots in the form of nanoparticles according to the present disclosure. In particular, it can be seen that a nanostructure with a desired pattern can be prepared effectively on a target substrate through only one transfer by selecting the hydrophilic/hydrophobic characteristics of the polymer on the substrate according to the hydrophilic/hydrophobic characteristics of the quantum dots.

CdSe and InP have hydrophobic surfaces whereas ZnO has a hydrophilic surface. According to the present disclosure, nanostructures with large areas can be prepared effectively by selecting polymers, solutions, etc. according to the characteristics of various materials having hydrophobic or hydrophilic surface.

In particular, according to the present disclosure, the initial substrate pattern can be realized as a nanostructure for the preparation of a large-area pattern and various angles and shapes can be realized by changing the stacking position and physical dimension of each layer. Accordingly, the present disclosure provides a higher degree of freedom of design than the prior art.

Figure 6:
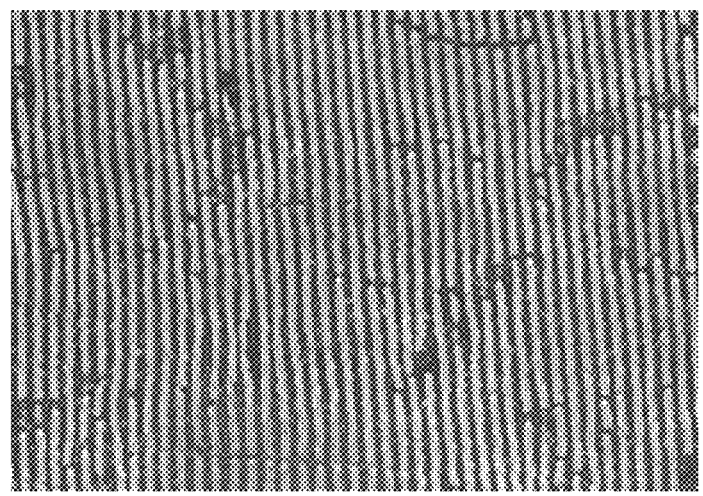
FIG. 6 shows a result of self-assembly transfer using steam according to the prior art.
Figure 7:
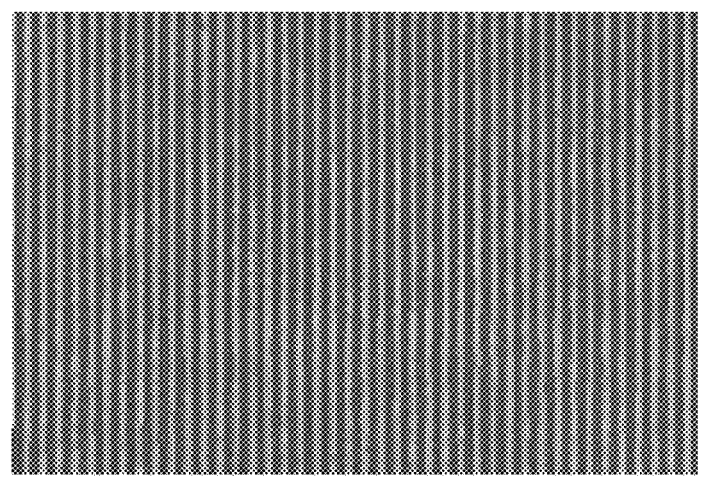
FIG. 7 shows a result of immersion-based transfer.

FIG. 6 shows a result of self-assembly transfer using steam according to the prior art, and FIG. 7 shows a result of immersion-based transfer.

Referring to FIGS. 6 and 7, it can be seen that uniform patterns were not formed throughout the substrate, unlike the nanostructure patterns formed by the method of the present disclosure shown in FIG. 5.

Two examples of colloidal solution-based nanoparticles formed according to the present disclosure will be described.

Figure 8:
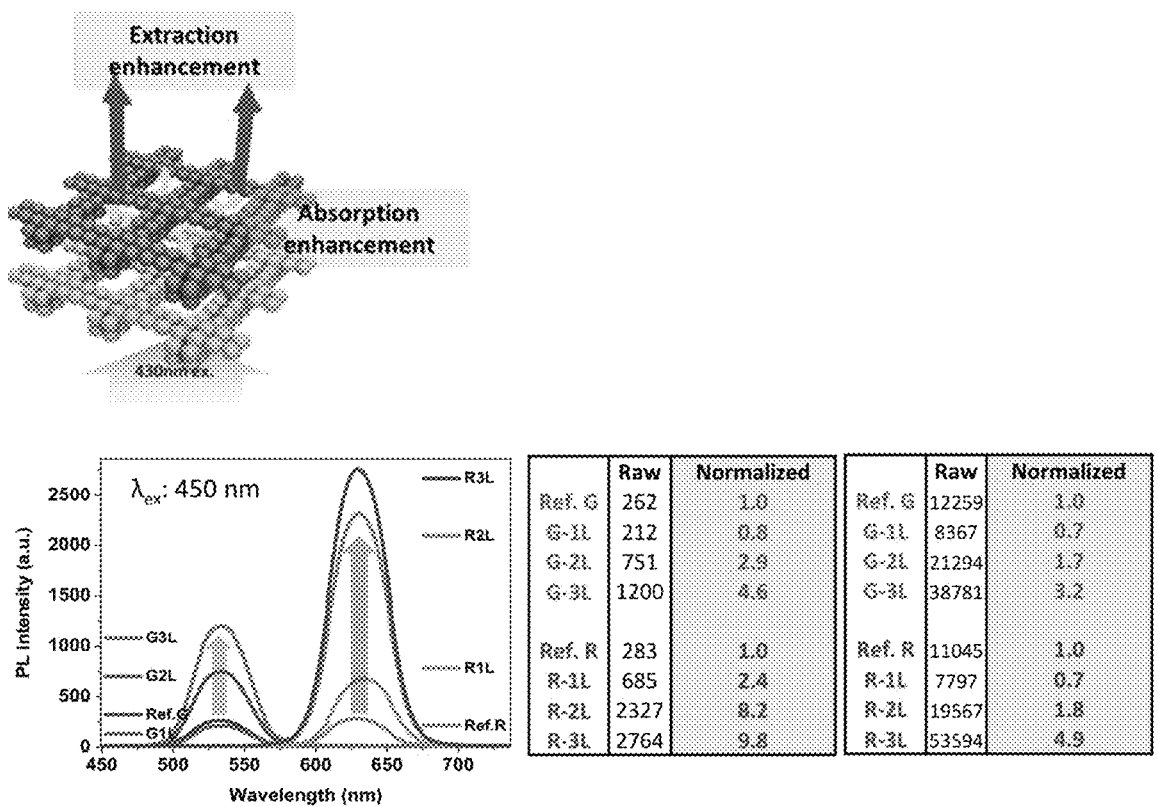
FIG. 8 illustrates an example wherein a nanostructure prepared according to an exemplary embodiment of the present disclosure is used.

FIG. 8 illustrates an example wherein a nanostructure prepared according to an exemplary embodiment of the present disclosure is used.

Referring to FIG. 8, when a structure is prepared using a material emitting light in the visible region such as CdSe or InP, the light irradiated into the structure may interact with the structure because it has a periodic structure (contrast exhibits between the empty space and the quantum dot materials). Specifically, the irradiation of light with a wavelength range similar to the periodicity of the periodic structure causes a scattering effect and leads to resonance inside a periodic space.

This can cause the increase of light absorption by the quantum dot materials that constitute the structure due to the confining effect of light and can also lead to the improvement of light extraction by the scattering effect due to the concave-convex structure unlike the existing quantum dot film in the form of a simple thin film. The photoluminescence (PL) graph at the upper right side of FIG. 8 shows the result of using the CdSe structure. For example, compared to a red CdSe comparative film, the R-2L structure sample containing about 1.8 times more quantum dots showed PL increased by 8.2 times, indicating that light absorption and extraction efficiencies were increased inside the structure. Consequently, the increase in photoluminescence intensity can be expected from the increased light absorption and extraction efficiencies of quantum dot materials.

Figure 9:
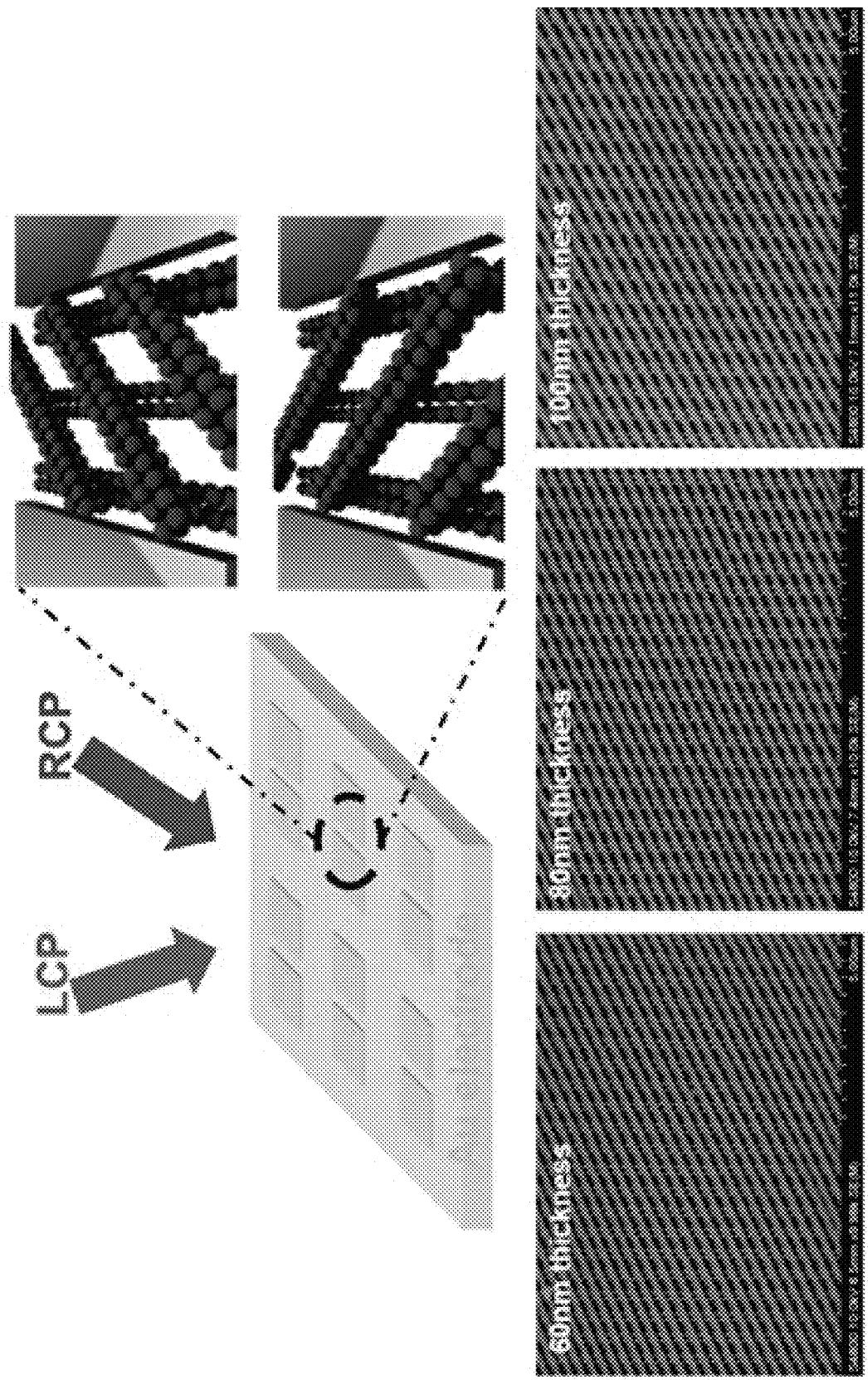
FIG. 9 illustrates an example wherein a nanostructure prepared on a substrate according to the present disclosure is used to fabricate a photodetection device.

FIG. 9 illustrates an example wherein a nanostructure prepared on a substrate according to the present disclosure is used to fabricate a photodetection device.

FIG. 9 shows an example of a structure made from PbS. It shows that the circular dichroism (CD) peaks can be controlled as desired through optimization of the structure. The parameters for structure control include structure thickness, rotation stacking, etc. The data in FIG. 9 show the tendency of CD depending on thickness. The result of FIG. 9 confirms the increase in CD intensity and the red-shift of CD peaks depending on the increase of thickness. The pattern quality of the structure should be good to achieve high CD intensity. The structure prepared according to the present disclosure showed very high CD intensity compared to the previously reported values (G value of up to 0.2-0.3).

As shown in the lower left side of FIG. 9, a CPL detector that reads the difference in photocurrent of LCP and RCP (left and right circularly polarized lights) can be implemented by adding an electrode. The CPL detector may be embodied to exhibit optimal performance corresponding to the target wavelength by optimizing the structure through the structure control parameters.

Figure 10:
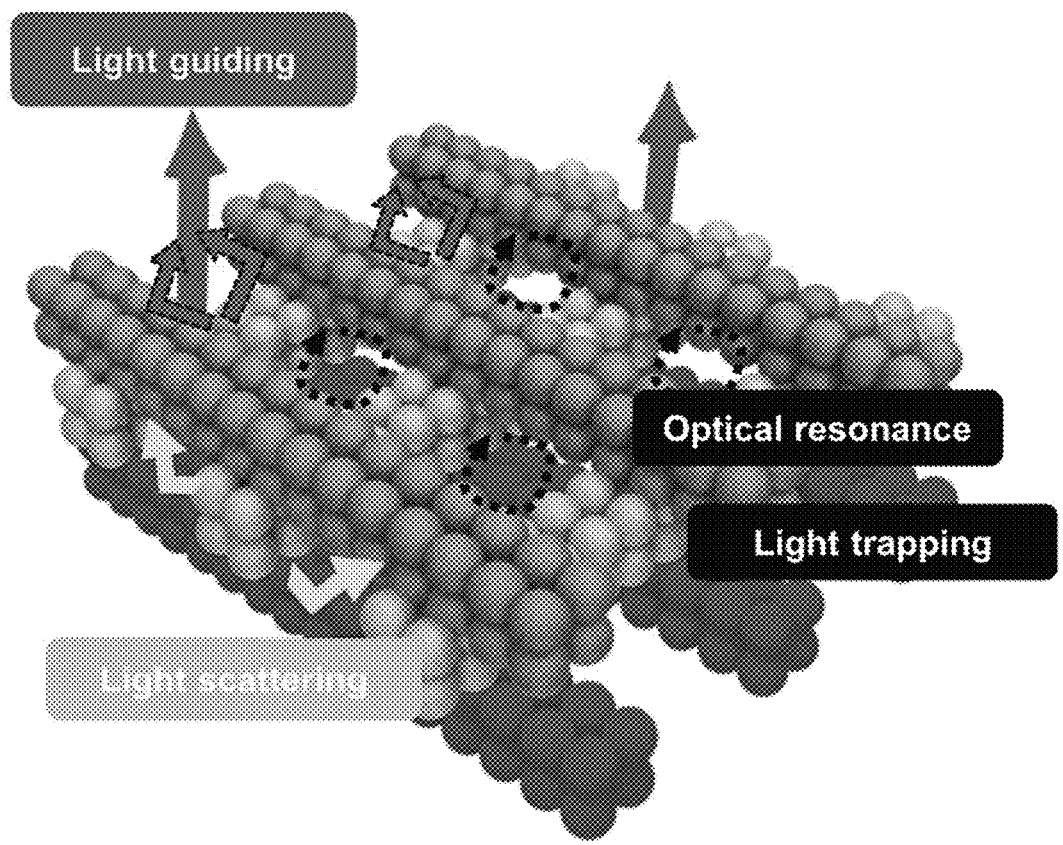
FIGS. 10 and 11 schematically show that a photonic structure and a chiral structure prepared according to the present disclosure can be applied to various optoelectronic device.
Figure 11:
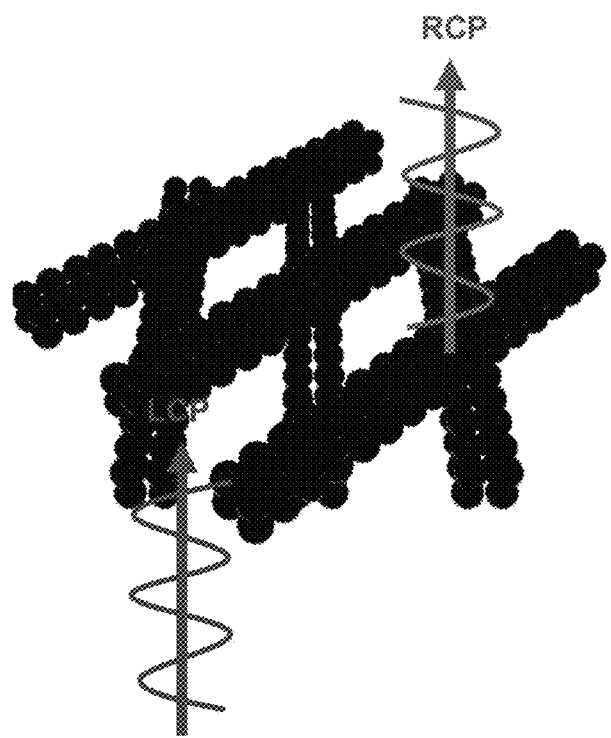

FIGS. 10 and 11 schematically show that the photonic structure and the chiral structure prepared according to the present disclosure can be applied to various optoelectronic device.

Referring to FIG. 10, it can be seen that it is possible to increase light extraction efficiency by controlling light path, increase light absorption by light trapping and optical resonance and control reflection and transmission based on the light scattering effect by using a photonic structure.

Referring to FIG. 11, geometric anisotropy may be conferred to the three-dimensional nanostructure by controlling structural variables (e.g., stacking angle or thickness) during the transfer step, which is associated with the chirality characteristics. That is to say, it is possible to implement a structure that selectively absorbs circularly polarized lights (RCP and LCP).

Figure 12:
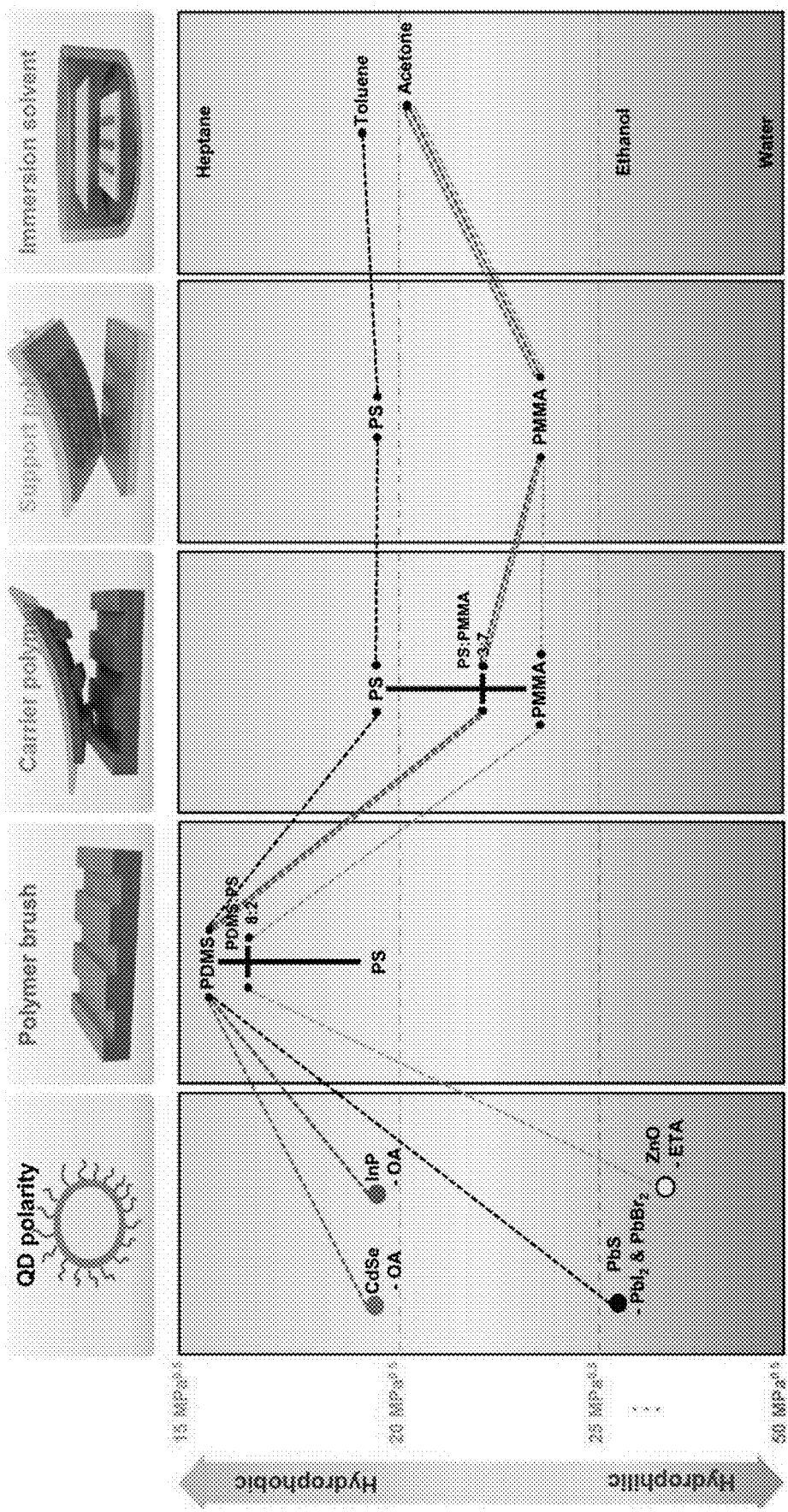
FIG. 12 schematically shows the application of the method of the present disclosure for various colloidal quantum dots depending on surface energy characteristics.

FIG. 12 schematically shows the application of the method of the present disclosure for various colloidal quantum dots depending on surface energy characteristics.

Referring to FIG. 12, a combination of hydrophilic/hydrophobic quantum dots and polymers can be applied to the process of the present disclosure.

Figure 13:
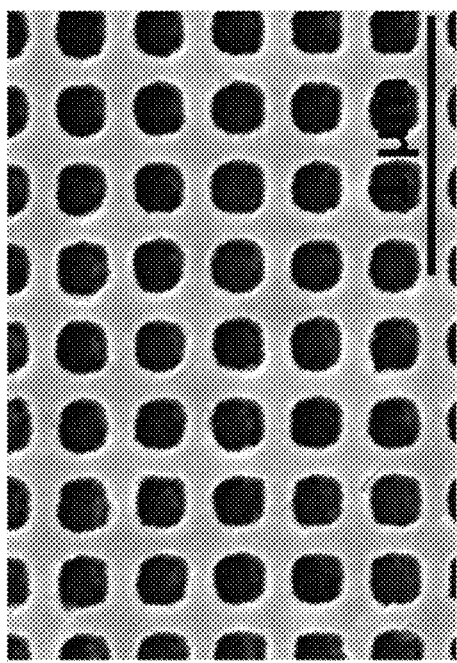
FIG. 13 illustrates the optical interaction between a structure and a quantum dot in a CdSe quantum dot-based two-dimensional nanostructure and its effect.
Figure 13:
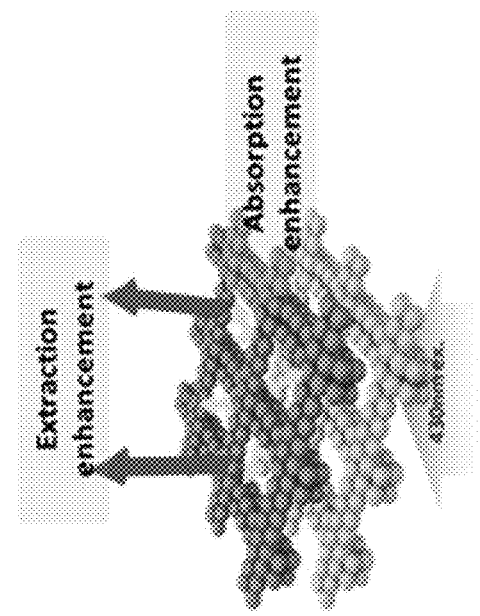
Figure 13:
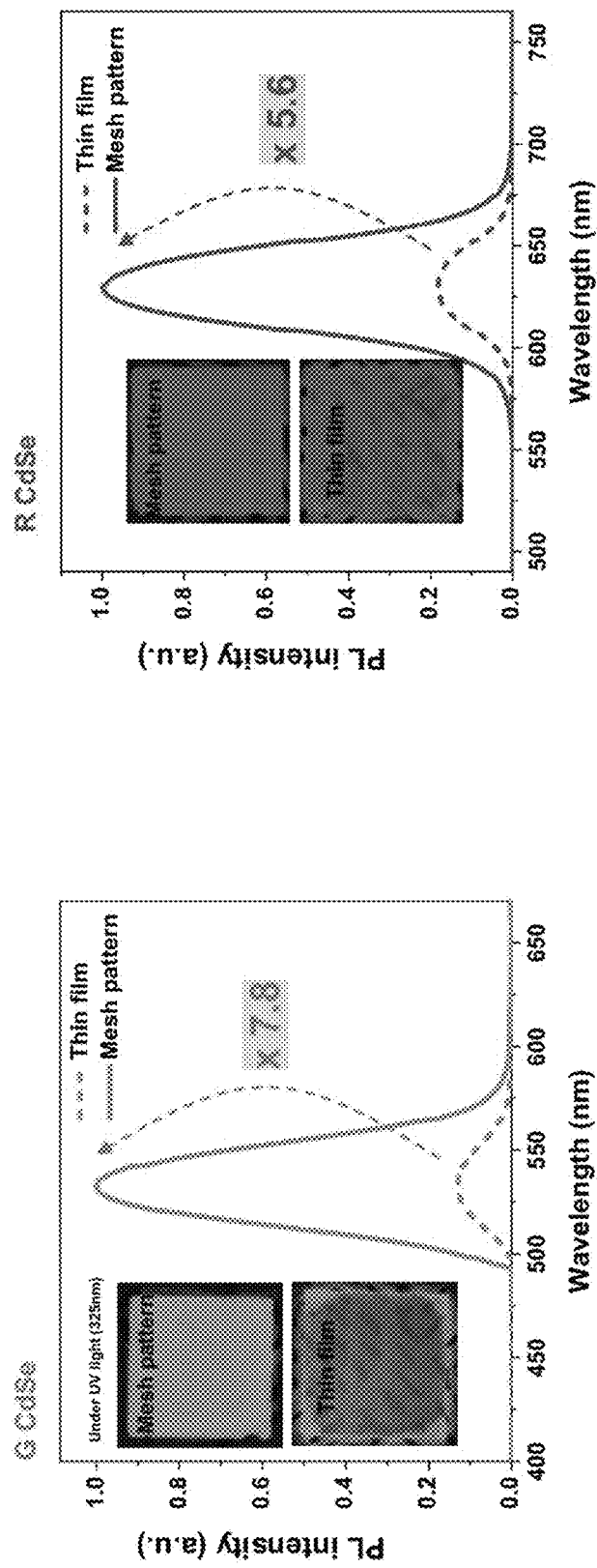

FIG. 13 illustrates the optical interaction between the structure and the quantum dot in the CdSe quantum dot-based two-dimensional nanostructure and its effect. The optical interaction between the structure and the quantum dot (increased light absorption due to optical resonance and increased light extraction due to decreased total reflection) was induced by preparing the CdSe quantum dot-based two-dimensional nanostructure.

Referring to FIG. 13, the shape, size and spatial distribution of the nanostructure were calculated by simulation to maximize light absorption at the wavelength of 450 nm. The luminescence intensity of blue and red quantum dots was increased by about 8 times and 6 times as compared to the existing structure.

Figure 14:
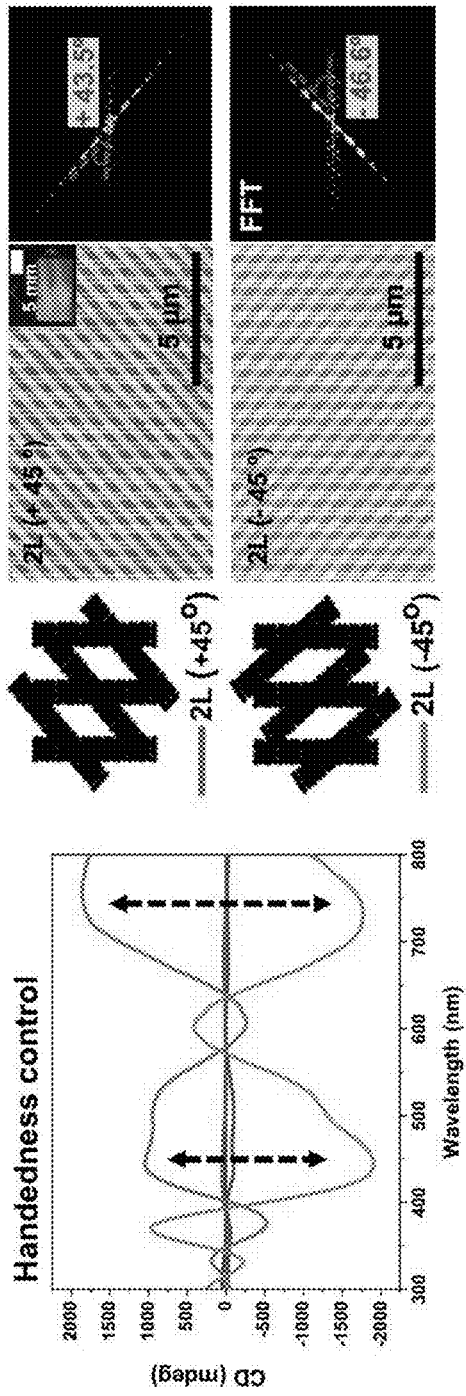
FIG. 14 illustrates the control of thickness and symmetry of a PbS quantum dot-based three-dimensional nanostructure and its optical effect.
Figure 14:
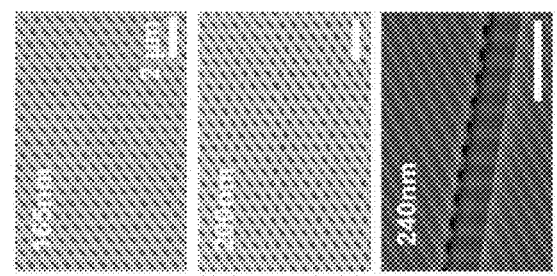
Figure 14:
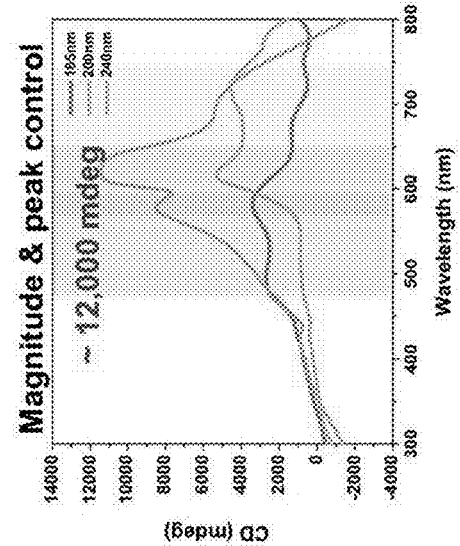
Figure 14:
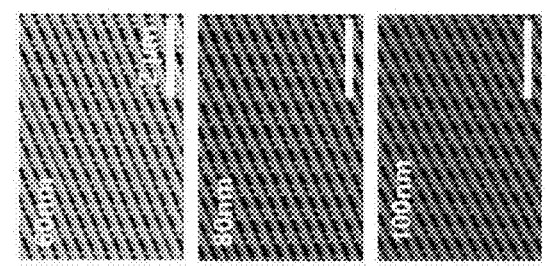
Figure 14:
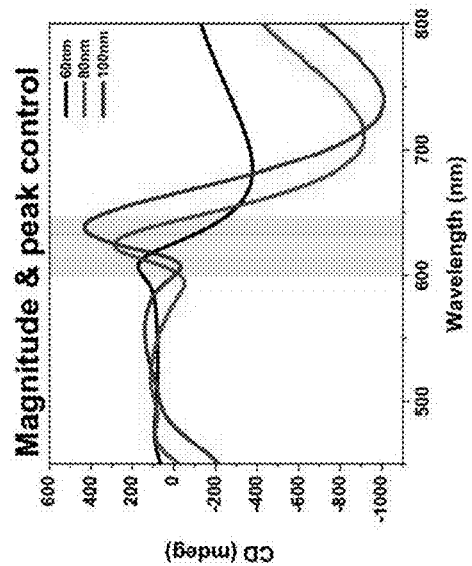

FIG. 14 illustrates the control of thickness and symmetry of the PbS quantum dot-based three-dimensional nanostructure and its optical effect. In this experiment, a twisted structure with high responsivity to circularly polarized light was fabricated. Specifically, it was investigated whether the intensity, peak position and handedness in circular dichroism (CD) spectra can be controlled by controlling several structural variables of PbS quantum dots such as thickness, stacking angle, etc. The chirality information of materials or structures can be confirmed from CD spectra. It is known that the intensity in the spectra increases as the twisted asymmetry characteristic is strengthened and it is difficult to control the various values in the spectra.

Referring to FIG. 14, the CD intensity of the structure using PbS quantum dots was 12,000 mdeg or higher, which is the highest value among the values reported thus far. It can be seen that the structure having CD intensity can exhibit high sensitivity for circularly polarized light and can be used as a polarization detector.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims. The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method for preparing a three-dimensional nanostructure using nanoparticles, comprising:
    a step of surface-treating a patterned pattern substrate with a polymer;
    a step of coating colloidal nanoparticles on the polymer;
    a step of removing an unwanted nanoparticle coating layer, leaving behind a nanoparticle coating layer;
    a step of bonding a carrier substrate having adhevisity to the nanoparticle coating layer;
    a step of separating the nanoparticle coating layer from the pattern substrate using the carrier substrate; and
    a step of forming a nanoparticle layer on a target substrate by contacting the carrier substrate with the target substrate and then removing the carrier substrate by immersing the carrier substrate in a solution.

2. The method for preparing a three-dimensional nanostructure using nanoparticles of claim 1, further comprising a step of forming another nanoparticle layer on the nanoparticle layer by repeating the method of claim 1 after the nanoparticle layer has been formed.

3. The method for preparing a three-dimensional nanostructure using nanoparticles of claim 2, which further comprises a step of conducting a capping process of filling between the nanoparticle layer after the nanoparticle layer has been formed before repeating the method of claim 1.

4. The method for preparing a three-dimensional nanostructure using nanoparticles of claim 1, wherein the unwanted nanoparticle coating layer is removed by a stamping method.

5. The method for preparing a three-dimensional nanostructure using nanoparticles of claim 1, wherein, when the nanoparticles have high hydrophilicity, the polymer used for the surface treatment is selected to have high hydrophilicity.

6. The method for preparing a three-dimensional nanostructure using nanoparticles of claim 1, wherein the nanoparticles are quantum dots.

7. The method for preparing a three-dimensional nanostructure using nanoparticles of claim 6, wherein the quantum dot is one or more selected from the group consisting of CdSe, InP, PbS, and ZnO.

8. The method for preparing a three-dimensional nanostructure using nanoparticles of claim 1, wherein the solution selectively dissolves only the carrier substrate without dissolving the nanoparticle coating layer and the target substrate.

9. A three-dimensional nanostructure prepared by the method of claim 1.

10. The three-dimensional nanostructure of claim 9, wherein nanoparticles are stacked in the nanostructure.

11. The three-dimensional nanostructure of claim 10, wherein the three-dimensional nanostructure has a multi-layer patterned structure.

12. The three-dimensional nanostructure of claim 11, wherein the multi-layer patterned structure is in the form of lines and the angle of the lines between the layers is twisted.

13. The three-dimensional nanostructure of claim 9, wherein, when the nanoparticles have high hydrophilicity, the polymer used for the surface treatment is selected to have high hydrophilicity.

14. The three-dimensional nanostructure of claim 9, wherein the solution selectively dissolves only the carrier substrate without dissolving the nanoparticle coating layer and the target substrate.

15. A display comprising the nanostructure of claim 9.

16. The display of claim 15, wherein the nanostructure comprises quantum dots.

17. The display of claim 16, wherein the quantum dot is one or more selected from the group consisting of CdSe, InP, PbS, and ZnO.

18. The display of claim 15, wherein, when the nanoparticles have high hydrophilicity, the polymer used for the surface treatment is selected to have high hydrophilicity.

19. The display of claim 15, wherein the solution selectively dissolves only the carrier substrate without dissolving the nanoparticle coating layer and the target substrate.

* * * * *